(12) United States Patent
Huang

(10) Patent No.: US 12,057,465 B2
(45) Date of Patent: Aug. 6, 2024

(54) SUPERLATTICE-BASED DETECTOR SYSTEMS AND METHODS

(71) Applicant: Teledyne FLIR Commercial Systems, Inc., Goleta, CA (US)

(72) Inventor: Edward K. Huang, Thousand Oaks, CA (US)

(73) Assignee: Teledyne FLIR Commercial Systems, Inc., Goleta, CA (US)

( * ) Notice: Subject to any disclaimer, the term of this patent is extended or adjusted under 35 U.S.C. 154(b) by 331 days.

(21) Appl. No.: 17/344,210

(22) Filed: Jun. 10, 2021

(65) Prior Publication Data

US 2021/0305307 A1 Sep. 30, 2021

Related U.S. Application Data

(63) Continuation of application No. PCT/US2019/063676, filed on Nov. 27, 2019.

(60) Provisional application No. 62/779,900, filed on Dec. 14, 2018.

(51) Int. Cl.
*H01L 27/146* (2006.01)
*H01L 31/0304* (2006.01)
*H01L 31/0352* (2006.01)
*H01L 31/18* (2006.01)

(52) U.S. Cl.
CPC .. *H01L 27/14652* (2013.01); *H01L 27/14694* (2013.01); *H01L 31/03046* (2013.01); *H01L 31/035263* (2013.01); *H01L 31/1844* (2013.01)

(58) Field of Classification Search
None
See application file for complete search history.

(56) References Cited

U.S. PATENT DOCUMENTS

| | | | |
|---|---|---|---|
| 8,372,717 | B2 | 2/2013 | Hsieh |
| 8,847,202 | B1 * | 9/2014 | Nosho ............... H01L 31/09 257/E31.093 |
| 9,159,853 | B2 | 10/2015 | Akita et al. |
| 9,647,155 | B1 * | 5/2017 | Maimon ......... H01L 31/03046 |
| 9,899,549 | B2 | 2/2018 | Machinga et al. |
| 9,917,155 | B2 | 3/2018 | Augusto |

(Continued)

FOREIGN PATENT DOCUMENTS

CN 108807588 A * 11/2018 ............ H01L 31/115

*Primary Examiner* — Nilufa Rahim
(74) *Attorney, Agent, or Firm* — Haynes and Boone, LLP

(57) ABSTRACT

Techniques are disclosed for facilitating detection of electromagnetic radiation using superlattice-based detector systems and methods. In one example, an infrared detector includes a first superlattice structure including first periods. Each of the first periods includes a first sub-layer and a second sub-layer adjacent to the first sub-layer. The first and second sub-layers include first and second semiconductor materials. The infrared detector further includes a second superlattice structure disposed on the first superlattice structure. The second superlattice structure includes second periods. Each of the second periods includes a third sub-layer and a fourth sub-layer adjacent to the third sub-layer. The third-sub-layer includes a third semiconductor material. The fourth sub-layer includes a fourth semiconductor material. A p-n junction is formed at an interface within the second superlattice structure or at an interface between the first and second superlattice structures.

20 Claims, 6 Drawing Sheets

(56) References Cited

U.S. PATENT DOCUMENTS

| | | |
|---|---|---|
| 9,941,431 B2 | 4/2018 | Miura et al. |
| 2002/0125472 A1 | 9/2002 | Johnson et al. |
| 2010/0155777 A1* | 6/2010 | Hill ...................... H01L 31/101 |
| | | 257/E31.022 |
| 2011/0037097 A1* | 2/2011 | Scott ..................... H01L 31/184 |
| | | 257/E31.003 |
| 2014/0374701 A1 | 12/2014 | Wei |
| 2016/0172530 A1* | 6/2016 | Tsuji .................. H01L 31/1868 |
| 2016/0307956 A1 | 10/2016 | Klipstein et al. |
| 2017/0179317 A1 | 6/2017 | Huang et al. |
| 2018/0069080 A1 | 3/2018 | He et al. |
| 2018/0122851 A1* | 5/2018 | Ettenberg ............ H01L 27/1465 |

* cited by examiner

SUPERLATTICE-BASED DETECTOR SYSTEMS AND METHODS

CROSS-REFERENCE TO RELATED APPLICATIONS

This application is a continuation of International Patent Application No. PCT/US2019/063676 filed Nov. 27, 2019 and entitled "SUPERLATTICE-BASED DETECTOR SYSTEMS AND METHOD," which is hereby incorporated by reference in its entirety.

International Patent Application No. PCT/US2019/063676 claims priority to and the benefit of U.S. Provisional Application No. 62/779,900 filed Dec. 14, 2018 and entitled "SUPERLATTICE-BASED DETECTOR SYSTEMS AND METHODS," which is hereby incorporated by reference in its entirety.

TECHNICAL FIELD

One or more embodiments relate generally to imaging systems and more particularly, for example, to superlattice-based detector systems and methods.

BACKGROUND

Imaging systems may include an array of detectors, with each detector functioning as a pixel to produce a portion of a two-dimensional image. There are a wide variety of image detectors, such as visible-light image detectors, infrared image detectors, or other types of image detectors that may be provided in an image detector array for capturing an image. As an example, a plurality of sensors may be provided in an image detector array to detect electromagnetic (EM) radiation at desired wavelengths. In some cases, such as for infrared imaging, readout of image data captured by the detectors may be performed in a time-multiplexed manner by a readout integrated circuit (ROIC). The image data that is read out may be communicated to other circuitry, such as for processing, storage, and/or display. In some cases, a combination of a detector array and an ROIC may be referred to as a focal plane array (FPA). Advances in process technology for FPAs and image processing have led to increased capabilities and sophistication of resulting imaging systems.

SUMMARY

In one or more embodiments, an infrared detector includes a first superlattice structure including a first plurality of periods. Each of the first plurality of periods includes a first sub-layer and a second sub-layer adjacent to the first sub-layer. The first sub-layer includes a first semiconductor material. The second sub-layer includes a second semiconductor material. The infrared detector further includes a second superlattice structure disposed on the first superlattice structure. The second superlattice structure includes a second plurality of periods. Each of the second plurality of periods includes a third sub-layer and a fourth sub-layer adjacent to the third sub-layer. The third sub-layer includes a third semiconductor material. The fourth sub-layer includes a fourth semiconductor material. A p-n junction is formed at an interface within the second superlattice structure or at an interface between the first and second superlattice structures.

In one or more embodiments, a method includes forming a first superlattice structure including a first plurality of periods. Each of the first plurality of periods includes a first sub-layer and a second sub-layer formed on the first sub-layer. The first sub-layer includes a first semiconductor material. The second sub-layer includes a second semiconductor material. The method further includes forming a second superlattice structure on the first superlattice structure. The second superlattice structure includes a second plurality of periods. Each of the second plurality of periods includes a third sub-layer and a fourth sub-layer formed on the third sub-layer. The third sub-layer includes a third semiconductor material. The fourth sub-layer includes a fourth semiconductor material. A p-n junction is formed at an interface within the second superlattice structure or at an interface between the first and second superlattice structures.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Figure 1:
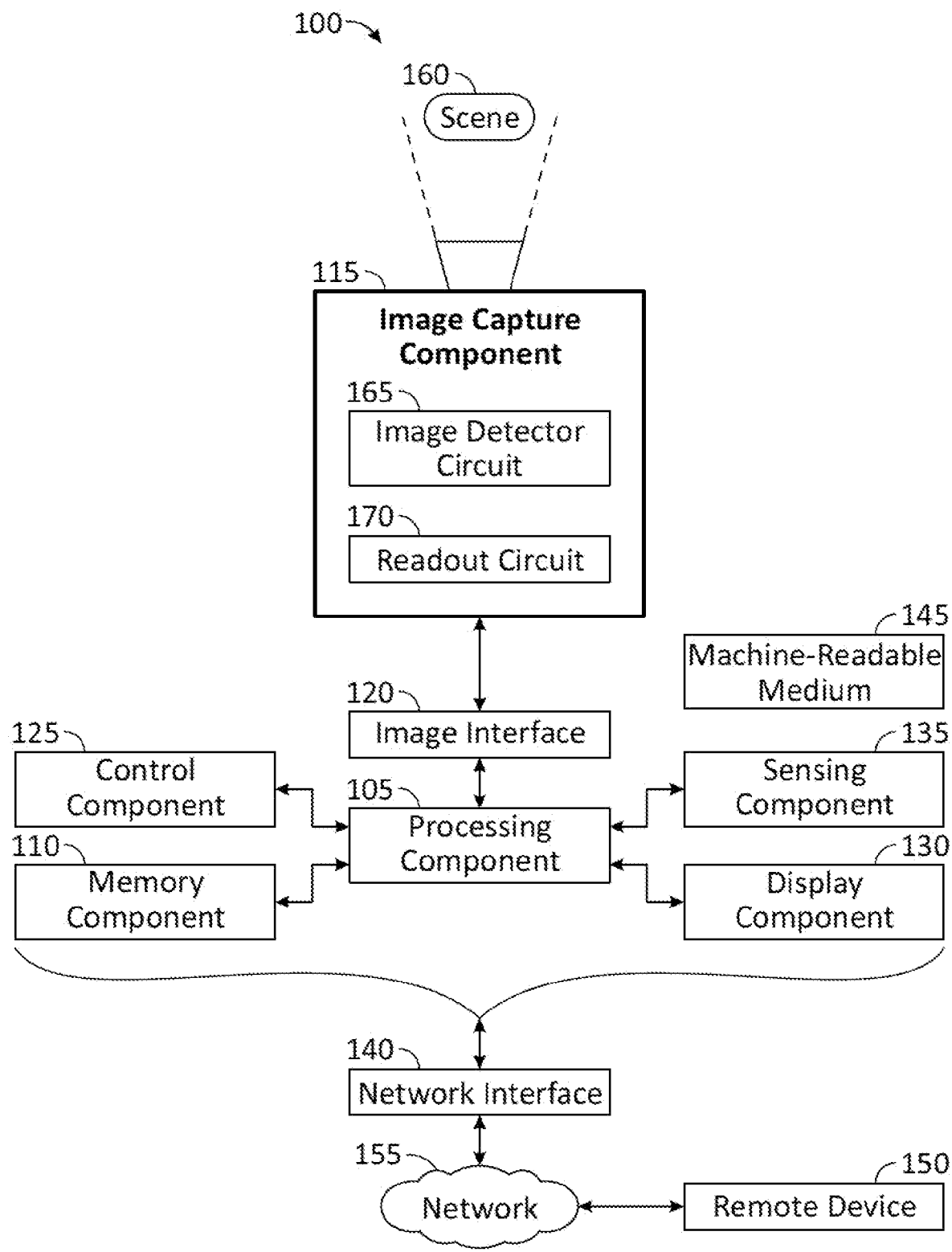
FIG. 1 illustrates a block diagram of an example imaging system in accordance with one or more embodiments of the present disclosure.

Embodiments of the present disclosure and their advantages are best understood by referring to the detailed description that follows. It is noted that sizes of various components and distances between these components are not drawn to scale in the figures. It should be appreciated that like reference numerals are used to identify like elements illustrated in one or more of the figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims. It is noted that sizes of various components are not necessarily drawn to scale in the drawings.

Various techniques are provided to facilitate detection of EM radiation using superlattice-based detector systems and methods. In some embodiments, an imaging system includes an image detector circuit and a readout circuit. The image detector circuit may include a detector array formed of detector elements. Each detector element detects image data associated with components of incident EM radiation and generates signals (e.g., electrical signals) indicative of the detected image data. The signals may include photocurrent generated by the detector element in response to incident EM radiation. Each detector element of the detector array may have a stacked detector structure. In some embodiments, the stacked detector structure includes a substrate layer, a first absorber layer, a second absorber layer, one or more superlattice (SL) structures between the first and second absorber layers, and a cap layer. The stacked detector structure may include a first contact layer and a second contact layer that can be coupled to the readout circuit to allow readout of the generated signals by the readout circuit. The contact layers may be metal layers formed on the stacked detector structure. Such a stacked detector structure may be referred to as a superlattice-based detector structure. The stacked detector structure may include stacked semiconductor layers. In some cases, one or more of the semiconductor layers may be formed through epitaxial growth. In an aspect, a superlattice structure includes a series of two or more alternating layers of different material and may define, for example, either matched or strained layers. Such layers of the superlattice structure may be referred to as layers or sub-layers.

The readout circuit is coupled to the first and second contact layers of the detector elements of the detector array to obtain, as part of a frame, the signals indicative of the image data that are generated by the detector elements. In an embodiment, a continuous portion (e.g., formed of a series of contiguous layers) of the stacked detector structure may have p-type conductivity, whereas a remaining continuous portion of the stacked detector structure may have n-type conductivity. Dopants may be utilized to define the conductivity type of the layers of the stacked detector structure. In an aspect, the dopants may be provided as part of epitaxial growth or subsequent to epitaxial growth (e.g., a zinc well formed after epitaxial growth). An example p-type dopant is zinc. An example n-type dopant is sulfur. In this regard, the stacked detector structure has a p-side and an n-side, where the p-side includes p-type layers (e.g., contiguous p-type layers) of the stacked detector structure and the n-side includes n-type layers (e.g., contiguous n-type layers) of the stacked detector structure. The first contact layer of the stacked detector structure is formed on the p-side of the stacked detector structure (e.g., formed on one of the p-type layers of the stacked detector structure). The second contact layer is formed on the n-side of the stacked detector structure (e.g., formed on one of the n-type layers of the stacked detector structure).

The stacked detector structure may include a first superlattice-based layer and a second superlattice-based layer. For explanatory purposes, the first superlattice-based layer is referred to as a superlattice-based absorber layer. In some cases, a p-n junction is formed at an interface of the superlattice-based absorber layer and the second superlattice-based layer. In other cases, a p-n junction is formed at an interface of an n-type layer of the second superlattice-based layer and a p-type layer of the second superlattice-based layer. The superlattice-based absorber layer may include alternating layers of two different semiconductor materials. As an example, the superlattice-based absorber layer may include alternating layers of indium gallium arsenide (InGaAs) and gallium arsenide antimonide (GaAsSb). Such a superlattice may be referred to as an InGaAs/GaAsSb superlattice. The superlattice-based absorber layer may be utilized to facilitate tuning of a cut-off wavelength (e.g., also referred to as a detection wavelength). In some aspects, the superlattice structure(s) may allow a longer detection wavelength (e.g., a longer cut-off wavelength), relative to a case in which the superlattice structure(s) are not employed. A wider bandgap (e.g., equivalently lower cut-off wavelength and higher cut-off frequency) is generally associated with lower dark current (e.g., lower generation-recombination current). As used herein, cut-off wavelength, cut-off frequency, and bandgap may be used interchangeably. Wavelength ranges may be provided equivalently using frequency ranges or energy ranges. In an aspect, wavelength ranges, frequency ranges, or energy ranges refer to portions of the EM spectrum and may be referred to as wavebands (or simply bands) or colors.

In an aspect, the second superlattice-based layer includes at least a first superlattice structure disposed on the superlattice-based absorber layer and a second superlattice structure disposed on the first superlattice structure. In some cases, the second superlattice-based layer has a graded bandgap and may be referred to as a superlattice-based graded-layer. In this regard, the second superlattice structure may have a wider bandgap than the first superlattice structure, and the first superlattice structure may have a wider bandgap than the superlattice-based absorber layer. In another aspect, the second superlattice-based layer includes a single superlattice structure. A bandgap of the superlattice-based absorber layer and each superlattice structure of the second superlattice-based layer is based on material composition and thickness of each sub-layer.

The second superlattice-based layer may be utilized to facilitate energy band alignment with the substrate layer, the first and second absorber layers, the superlattice-based absorber layer, and the cap layer to facilitate flow of photogenerated carriers. In this regard, the superlattice-based absorber layer and the second superlattice-based layer may facilitate tunability of conduction and valence energy bands. In some aspects, the bandgap of the layers of the stacked detector structure are defined to facilitate flow of photogenerated carriers. As an example, the valence band of the p-side of the stacked detector structure may be aligned (e.g., substantially aligned) to facilitate flow of holes. Such alignment avoids an abrupt energy transition that acts as an energy barrier that blocks transport of the holes (e.g., blocks the photogenerated signal). Generation-recombination (G-R) current is a function of the bandgap, where a larger bandgap is associated with a lower G-R current. In some cases, a depletion region associated with the p-n junction of the stacked detector structure is positioned mostly in the wider bandgap material as opposed to the narrower bandgap material to avoid higher G-R current associated with the narrower bandgap material. A graded bandgap may be provided to reduce the G-R current created in the depletion region. In some cases, the second superlattice-based layer may create an electric field that helps sweep carriers across the p-n junction of the stacked detector structure, and/or utilized to mitigate dark current (e.g., mitigate generation-recombination current).

In some embodiments, the superlattice-based detector structure may be provided to facilitate detection of infrared radiation. The infrared spectrum covers a wide range of wavelengths that are longer than visible wavelengths, but shorter than microwave wavelengths. The short-wave infrared (SWIR) wavelengths cover the range of about 1 μm to 3 μm, and certain types of infrared detectors are designed to respond to the energy of wavelengths within the SWIR portion of the infrared region.

In an embodiment, the superlattice-based detectors include an indium phosphide (InP) substrate layer, an n-type InGaAs absorber layer, a p-type InGaAs absorber layer, one or more superlattice structures between the n-type and p-type InGaAs absorber layers, and an InP cap layer. In this embodiment, the superlattice-based detector has an InGaAs-based detector, with InGaAs as its absorber and the InGaAs grown on InP substrates. Such a material system may be utilized to form an SWIR FPA. In some aspects, the lattice constant is substantially constant across layers of such a superlattice-based detector. The layers may be epitaxially grown. For example, the n-type InGaAs absorber layer may be epitaxially grown on the InP substrate layer, a first sub-layer of the superlattice-based absorber layer epitaxially grown on the n-type InGaAs absorber, a second sub-layer of the superlattice-based absorber layer epitaxially grown on the first sub-layer, and so forth, ending with the InP cap layer epitaxially grown on the p-type InGaAs absorber layer. The InP cap layer may accumulate holes that are read out to the readout circuit. In an aspect, the superlattice-based absorber layer may be a strain-layered superlattice (SLS) that includes alternating layers of InGaAs (e.g., $In_{0.53}Ga_{0.47}As$) and GaAsSb (e.g., $GaAs_{0.5}Sb_{0.5}$) quantum wells.

By forming the InGaAs-based detector using superlattice structures, electrical properties associated with the InGaAs-based detector can be tuned while maintaining crystalline quality. In an embodiment, such a material system may be utilized to facilitate detection of SWIR radiation and may provide a cut-off wavelength that can be tuned by extending or shortening quantum well periods while remaining lattice matched to the InP substrate layer and the cap layer. The cut-off wavelength of such superlattice-based detectors can be tuned by tuning properties of the superlattice structure(s), such as thickness and material composition of the layers of the superlattice structure(s). The superlattice structure(s) may be utilized to allow a longer detection wavelength (e.g., a longer cut-off wavelength), relative to a case in which the superlattice structure(s) are not employed. For example, without the superlattice structure(s), the cut-off wavelength provided by the InGaAs absorber layers may be around 1.7 μm (e.g., at 300 K). In an aspect, by providing the superlattice structure(s) between the n-type and p-type InGaAs absorber layers, the superlattice structure(s) and the n-type and p-type InGaAs absorber layers may effectively provide a cut-off wavelength approximately between 2 μm to 3 μm, thus providing an extended cut-off wavelength relative to a detector structure without the superlattice structure(s). Such an extended cut-off wavelength may be referred to as extended-SWIR waveband (e.g., also denoted as e-SWIR) and is extended relative to the SWIR waveband provided by the InGaAs absorber layers without the superlattice structure(s).

By building the superlattice structure(s) upon an InGaAs-based detector structure, fabrication techniques and low dark current properties of an InGaAs-based detector structure can be leveraged while allowing detection of the extended cut-off wavelength. In some cases, low dark current properties of InGaAs-based detector structures facilitate its operation at room temperature. In an aspect, the superlattice-based detector includes a superlattice-based graded-gap layer with a bandgap that is graded incrementally starting from bulk InGaAs to a wide bandgap superlattice composed of mostly InGaAs and then to a smaller bandgap extended-SWIR superlattice. Such grading of the energy bands may facilitate flow of photogenerated carriers, in contrast to an abrupt energy transition that may create an energy barrier that may potentially block signals. In some cases, the graded bandgap may be provided to reduce the G-R current created in the depletion region while providing a narrowed bandgap to the InGaAs absorber layer to allow a longer cut-off wavelength. In this regard, grading the bandgap may allow low dark current performance associated with the wider bandgap, while allowing detection of higher wavelength light (e.g., associated with narrower bandgap).

Material system and/or architecture utilized to implement the stacked detector structures are generally application specific. For example, the material system and/or architecture may be configured to have a desired bandgap(s) (e.g., desired combination/arrangement of bandgaps), facilitate extraction of photocarriers, and/or facilitate blocking of majority carriers. N-type and p-type layers may be composed of any semiconductor material (e.g., photosensitive semiconductor material) with n-type doping and p-type doping, respectively. Superlattice designs (e.g., material composition, dimension of each layer) and associated doping profiles may be selected to facilitate flow of (e.g., unimpeded flow of) photogenerated carriers at semiconductor contacts of the p-n junction of the stacked detector structures.

Various embodiments of methods and systems disclosed herein may be included in or implemented as various devices and systems such as infrared imaging systems, visible-light imaging systems, imaging systems having visible-light and infrared imaging capability, mobile digital cameras, video surveillance systems, video processing systems, or other systems or devices that may need to obtain image data in a portion of the EM spectrum.

Referring now to the drawings, FIG. 1 illustrates a block diagram of an example imaging system 100 (e.g., an infrared camera) in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The imaging system 100 may be utilized for capturing and processing images in accordance with an embodiment of the disclosure. The imaging system 100 may represent any type of imaging system that detects one or more ranges (e.g., wavebands) of EM radiation and provides representative data (e.g., one or more still image frames or video image frames). In an embodiment, the imaging system 100 may include a portable device and may be incorporated, for example, into a vehicle or a non-mobile installation requiring images to be stored and/or displayed. The vehicle may be a land-based vehicle (e.g., automobile), a naval-based vehicle, an aerial vehicle (e.g., unmanned aerial vehicle (UAV)), a space vehicle, or generally any type of vehicle that may incorporate (e.g., installed within, mounted thereon, etc.) the imaging system 100.

The imaging system 100 includes, according to one implementation, a processing component 105, a memory component 110, an image capture component 115, an image interface 120, a control component 125, a display component 130, a sensing component 135, and/or a network interface 140. The processing component 105, according to various embodiments, includes one or more of a processor, a microprocessor, a single-core processor, a multi-core processor, a microcontroller, a programmable logic device (PLD) (e.g., field programmable gate array (FPGA)), a digital signal processing (DSP) device, or other logic device that may be configured, by hardwiring, executing software instructions, or a combination of both, to perform various operations discussed herein for embodiments of the disclosure. The processing component 105 may be configured to interface and communicate with the various other components (e.g., 110, 115, 120, 125, 130, 135, etc.) of the imaging system 100 to perform such operations. For example, the processing component 105 may be configured to process captured image data received from the image capture component 115, store the image data in the memory component 110, and/or retrieve stored image data from the memory component 110. In one aspect, the processing component 105 may be configured to perform various system control operations (e.g., to control communications and operations of various components of the imaging system 100) and other image processing operations (e.g., data conversion, video analytics, etc.).

The memory component 110 includes, in one embodiment, one or more memory devices configured to store data and information, including infrared image data and information.

The memory component 110 may include one or more various types of memory devices including volatile and non-volatile memory devices, such as random access memory (RAM), read-only memory (ROM), electrically-erasable programmable read-only memory (EEPROM), flash memory, hard disk drive, and/or other types of memory. As discussed above, the processing component 105 may be configured to execute software instructions stored in the memory component 110 so as to perform method and process steps and/or operations. The processing component 105 and/or the image interface 120 may be configured to store in the memory component 110 images or digital image data captured by the image capture component 115. The processing component 105 may be configured to store processed still and/or video images in the memory component 110.

In some embodiments, a separate machine-readable medium 145 (e.g., a memory, such as a hard drive, a compact disk, a digital video disk, or a flash memory) may store the software instructions and/or configuration data which can be executed or accessed by a computer (e.g., a logic device or processor-based system) to perform various methods and operations, such as methods and operations associated with processing image data. In one aspect, the machine-readable medium 145 may be portable and/or located separate from the imaging system 100, with the stored software instructions and/or data provided to the imaging system 100 by coupling the machine-readable medium 145 to the imaging system 100 and/or by the imaging system 100 downloading (e.g., via a wired link and/or a wireless link) from the machine-readable medium 145. It should be appreciated that various modules may be integrated in software and/or hardware as part of the processing component 105, with code (e.g., software or configuration data) for the modules stored, for example, in the memory component 110.

The imaging system 100 may represent an imaging device, such as a video and/or still camera, to capture and process images and/or videos of a scene 160. In this regard, the image capture component 115 of the imaging system 100 may be configured to capture images (e.g., still and/or video images) of the scene 160 in a particular spectrum or modality. The image capture component 115 includes an image detector circuit 165 (e.g., a thermal infrared detector circuit) and a readout circuit 170 (e.g., an ROIC). For example, the image capture component 115 may include an IR imaging sensor (e.g., IR imaging sensor array) configured to detect IR radiation in the near, middle, and/or far IR spectrum and provide IR images (e.g., IR image data or signal) representative of the IR radiation from the scene 160. For example, the image detector circuit 165 may capture (e.g., detect, sense) IR radiation with wavelengths in the range from around 700 nm to around 2 mm, or portion thereof. For example, in some aspects, the image detector circuit 165 may be sensitive to (e.g., better detect) SWIR radiation, mid-wave IR (MWIR) radiation (e.g., EM radiation with wavelength of 2-5 µm) and/or long-wave IR (LWIR) radiation (e.g., EM radiation with wavelength of 7-14 µm), or any desired IR wavelengths (e.g., generally in the 0.7 to 14 µm range). In other aspects, the image detector circuit 165 may capture radiation from one or more other wavebands of the EM spectrum, such as visible-light, ultraviolet light, and so forth.

The image detector circuit 165 may capture image data associated with the scene 160. To capture the image, the image detector circuit 165 may detect image data of the scene 160 (e.g., in the form of EM radiation) and generate pixel values of the image based on the scene 160. An image may be referred to as a frame or an image frame. In some cases, the image detector circuit 165 may include an array of detectors (e.g., also referred to as an array of pixels) that can detect radiation of a certain waveband, convert the detected radiation into electrical signals (e.g., voltages, currents, etc.), and generate the pixel values based on the electrical signals. Each detector in the array may capture a respective portion of the image data and generate a pixel value based on the respective portion captured by the detector. The pixel value generated by the detector may be referred to as an output of the detector.

In one or more embodiments, the image detector circuit 165 may include absorption detector elements that include superlattice structures for detecting, for example, SWIR radiation. In one embodiment, the image detector circuit 165 includes an InGaAs-based detector structure with superlattice structure(s). The superlattice structure(s) may be utilized to allow a longer detection wavelength (e.g., a longer cut-off wavelength), relative to a case in which the superlattice structure(s) are not employed.

The image may be, or may be considered, a data structure that includes pixels and is a representation of the image data associated with the scene 160, with each pixel having a pixel value that represents EM radiation emitted or reflected from a portion of the scene and received by a detector that generates the pixel value. Based on context, a pixel may refer to a detector of the image detector circuit 165 that generates an associated pixel value or a pixel (e.g., pixel location, pixel coordinate) of the image formed from the generated pixel values.

In an aspect, the pixel values generated by the image detector circuit 165 may be represented in terms of digital count values generated based on the electrical signals obtained from converting the detected radiation. For example, in a case that the image detector circuit 165 includes or is otherwise coupled to an analog-to-digital converter (ADC) circuit, the ADC circuit may generate digital count values based on the electrical signals. For an ADC circuit that can represent an electrical signal using 14 bits, the digital count value may range from 0 to 16,383. In such cases, the pixel value of the detector may be the digital count value output from the ADC circuit. In other cases (e.g., in cases without an ADC circuit), the pixel value may be analog in nature with a value that is, or is indicative of, the value of the electrical signal. As an example, for infrared imaging, a larger amount of IR radiation being incident on and detected by the image detector circuit 165 (e.g., an IR image detector circuit) is associated with higher digital count values and higher temperatures.

The readout circuit 170 may be utilized as an interface between the image detector circuit 165 that detects the image data and the processing component 105 that processes the detected image data as read out by the readout circuit 170, with communication of data from the readout circuit 170 to the processing component 105 facilitated by the image interface 120. An image capturing frame rate may refer to the rate (e.g., images per second) at which images are detected in a sequence by the image detector circuit 165 and provided to the processing component 105 by the readout circuit 170. The readout circuit 170 may read out the pixel values generated by the image detector circuit 165 in accordance with an integration time (e.g., also referred to as an integration period).

In various embodiments, a combination of the image detector circuit 165 and the readout circuit 170 may be, may include, or may together provide an FPA. In some aspects, the image detector circuit 165 may be a thermal image detector circuit that includes an array of microbolometers, and the combination of the image detector circuit 165 and the readout circuit 170 may be referred to as a microbolometer FPA. In some cases, the array of microbolometers may be arranged in rows and columns. The microbolometers may detect IR radiation and generate pixel values based on the detected IR radiation. For example, in some cases, the microbolometers may be thermal IR detectors that detect IR radiation in the form of heat energy and generate pixel values based on the amount of heat energy detected. The microbolometer FPA may include IR detecting materials such as amorphous silicon (a-Si), vanadium oxide ($VO_x$), a combination thereof, and/or other detecting material(s). In an aspect, for a microbolometer FPA, the integration time may be, or may be indicative of, a time interval during which the microbolometers are biased. In this case, a longer integration time may be associated with higher gain of the IR signal, but not more IR radiation being collected. The IR radiation may be collected in the form of heat energy by the microbolometers.

In some cases, the image capture component 115 may include one or more filters adapted to pass radiation of some wavelengths but substantially block radiation of other wavelengths. For example, the image capture component 115 may be an IR imaging device that includes one or more filters adapted to pass IR radiation of some wavelengths while substantially blocking IR radiation of other wavelengths (e.g., MWIR filters, thermal IR filters, and narrow-band filters). In this example, such filters may be utilized to tailor the image capture component 115 for increased sensitivity to a desired band of IR wavelengths. In an aspect, an IR imaging device may be referred to as a thermal imaging device when the IR imaging device is tailored for capturing thermal IR images. Other imaging devices, including IR imaging devices tailored for capturing infrared IR images outside the thermal range, may be referred to as non-thermal imaging devices.

In one specific, not-limiting example, the image capture component 115 may include an IR imaging sensor having an FPA of detectors responsive to IR radiation including near infrared (NIR), SWIR, MWIR, long-wave IR (LWIR), and/or very-long wave IR (VLWIR) radiation. In some other embodiments, alternatively or in addition, the image capture component 115 may include a complementary metal oxide semiconductor (CMOS) sensor or a charge-coupled device (CCD) sensor that can be found in any consumer camera (e.g., visible light camera).

Other imaging sensors that may be embodied in the image capture component 115 include a photonic mixer device (PMD) imaging sensor or other time of flight (ToF) imaging sensor, light detection and ranging (LIDAR) imaging device, millimeter imaging device, positron emission tomography (PET) scanner, single photon emission computed tomography (SPECT) scanner, ultrasonic imaging device, or other imaging devices operating in particular modalities and/or spectra. It is noted that for some of these imaging sensors that are configured to capture images in particular modalities and/or spectra (e.g., infrared spectrum, etc.), they are more prone to produce images with low frequency shading, for example, when compared with a typical CMOS-based or CCD-based imaging sensors or other imaging sensors, imaging scanners, or imaging devices of different modalities.

The images, or the digital image data corresponding to the images, provided by the image capture component 115 may be associated with respective image dimensions (also referred to as pixel dimensions). An image dimension, or pixel dimension, generally refers to the number of pixels in an image, which may be expressed, for example, in width multiplied by height for two-dimensional images or otherwise appropriate for relevant dimension or shape of the image. Thus, images having a native resolution may be resized to a smaller size (e.g., having smaller pixel dimensions) in order to, for example, reduce the cost of processing and analyzing the images. Filters (e.g., a non-uniformity estimate) may be generated based on an analysis of the resized images. The filters may then be resized to the native resolution and dimensions of the images, before being applied to the images.

The image interface 120 may include, in some embodiments, appropriate input ports, connectors, switches, and/or circuitry configured to interface with external devices (e.g., a remote device 150 and/or other devices) to receive images (e.g., digital image data) generated by or otherwise stored at the external devices. The received images or image data may be provided to the processing component 105. In this regard, the received images or image data may be converted into signals or data suitable for processing by the processing component 105. For example, in one embodiment, the image interface 120 may be configured to receive analog video data and convert it into suitable digital data to be provided to the processing component 105.

In some embodiments, the image interface 120 may include various standard video ports, which may be connected to a video player, a video camera, or other devices capable of generating standard video signals, and may convert the received video signals into digital video/image data suitable for processing by the processing component 105. In some embodiments, the image interface 120 may also be configured to interface with and receive images (e.g., image data) from the image capture component 115. In other embodiments, the image capture component 115 may interface directly with the processing component 105.

The control component 125 includes, in one embodiment, a user input and/or an interface device, such as a rotatable knob (e.g., potentiometer), push buttons, slide bar, keyboard, and/or other devices, that is adapted to generate a user input control signal. The processing component 105 may be configured to sense control input signals from a user via the control component 125 and respond to any sensed control input signals received therefrom. The processing component 105 may be configured to interpret such a control input signal as a value, as generally understood by one skilled in the art. In one embodiment, the control component 125 may include a control unit (e.g., a wired or wireless handheld control unit) having push buttons adapted to interface with a user and receive user input control values. In one implementation, the push buttons of the control unit may be used to control various functions of the imaging system 100, such as autofocus, menu enable and selection, field of view, brightness, contrast, noise filtering, image enhancement, and/or various other features of an imaging system or camera.

The display component 130 includes, in one embodiment, an image display device (e.g., a liquid crystal display (LCD)) or various other types of generally known video displays or monitors. The processing component 105 may be configured to display image data and information on the display component 130. The processing component 105 may be configured to retrieve image data and information from the memory component 110 and display any retrieved image data and information on the display component 130. The display component 130 may include display circuitry, which may be utilized by the processing component 105 to display image data and information. The display component 130 may be adapted to receive image data and information directly from the image capture component 115, processing component 105, and/or image interface 120, or the image data and information may be transferred from the memory component 110 via the processing component 105.

The sensing component 135 includes, in one embodiment, one or more sensors of various types, depending on the application or implementation requirements, as would be understood by one skilled in the art. Sensors of the sensing component 135 provide data and/or information to at least the processing component 105. In one aspect, the processing component 105 may be configured to communicate with the sensing component 135. In various implementations, the sensing component 135 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder or time-of-flight camera), and/or whether a tunnel or other type of enclosure has been entered or exited. The sensing component 135 may represent conventional sensors as generally known by one skilled in the art for monitoring various conditions (e.g., environmental conditions) that may have an effect (e.g., on the image appearance) on the image data provided by the image capture component 115.

In some implementations, the sensing component 135 (e.g., one or more sensors) may include devices that relay information to the processing component 105 via wired and/or wireless communication. For example, the sensing component 135 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques. In some embodiments, the processing component 105 can use the information (e.g., sensing data) retrieved from the sensing component 135 to modify a configuration of the image capture component 115 (e.g., adjusting a light sensitivity level, adjusting a direction or angle of the image capture component 115, adjusting an aperture, etc.).

In some embodiments, various components of the imaging system 100 may be distributed and in communication with one another over a network 155. In this regard, the imaging system 100 may include a network interface 140 configured to facilitate wired and/or wireless communication among various components of the imaging system 100 over the network 155. In such embodiments, components may also be replicated if desired for particular applications of the imaging system 100. That is, components configured for same or similar operations may be distributed over a network. Further, all or part of any one of the various components may be implemented using appropriate components of the remote device 150 (e.g., a conventional digital video recorder (DVR), a computer configured for image processing, and/or other device) in communication with various components of the imaging system 100 via the network interface 140 over the network 155, if desired. Thus, for example, all or part of the processing component 105, all or part of the memory component 110, and/or all of part of the display component 130 may be implemented or replicated at the remote device 150. In some embodiments, the imaging system 100 may not include imaging sensors (e.g., image capture component 115), but instead receive images or image data from imaging sensors located separately and remotely from the processing component 105 and/or other components of the imaging system 100. It will be appreciated that many other combinations of distributed implementations of the imaging system 100 are possible, without departing from the scope and spirit of the disclosure.

Furthermore, in various embodiments, various components of the imaging system 100 may be combined and/or implemented or not, as desired or depending on the application or requirements. In one example, the processing component 105 may be combined with the memory component 110, image capture component 115, image interface 120, display component 130, sensing component 135, and/or network interface 140. In another example, the processing component 105 may be combined with the image capture component 115, such that certain functions of processing component 105 are performed by circuitry (e.g., a processor, a microprocessor, a logic device, a microcontroller, etc.) within the image capture component 115.

Figure 2A:
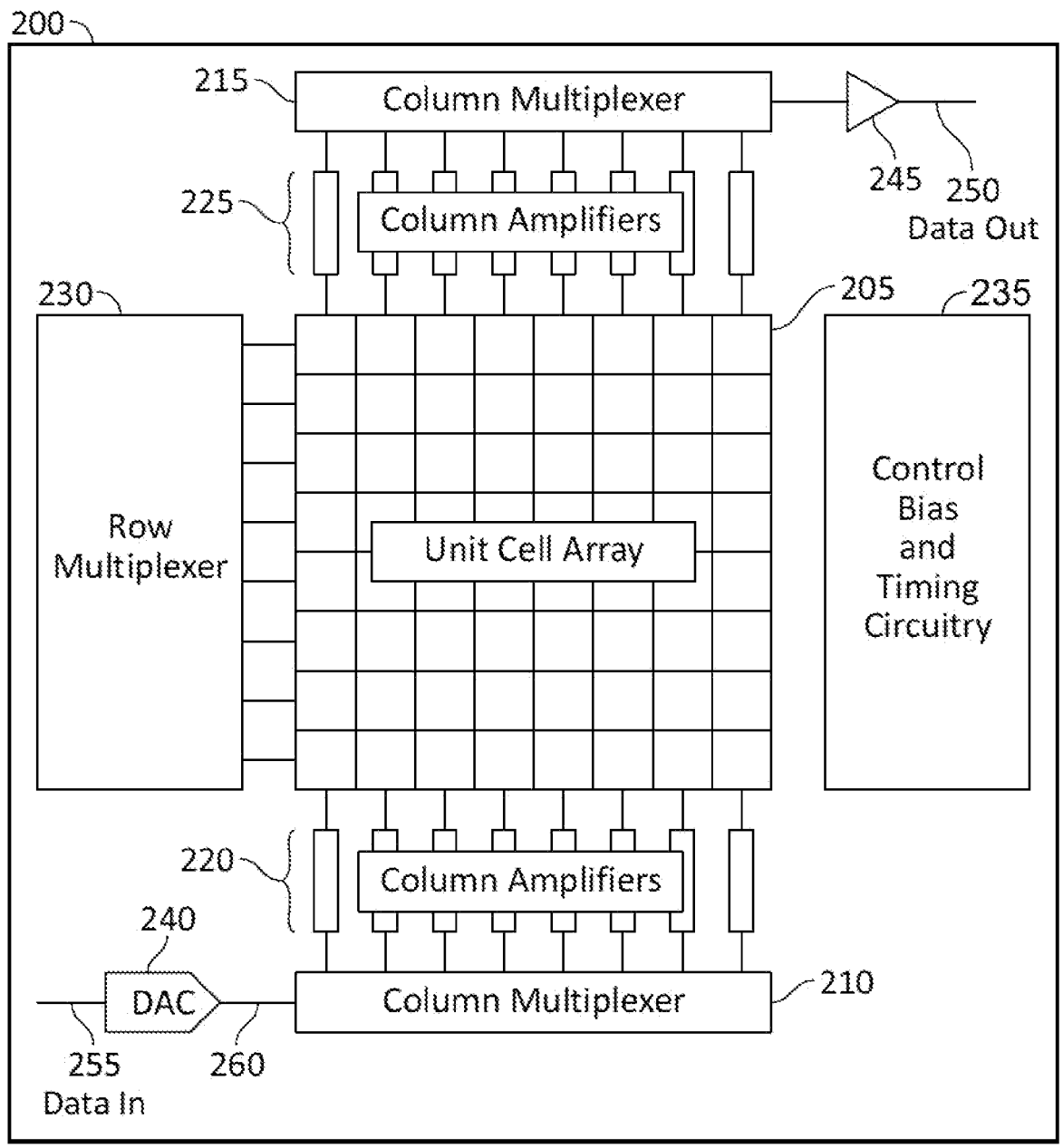
FIG. 2A illustrates a block diagram of an example image sensor assembly in accordance with one or more embodiments of the present disclosure.

FIG. 2A illustrates a block diagram of an example image sensor assembly 200 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 200 may be an FPA, for example, implemented as the image capture component 115 of FIG. 1.

The image sensor assembly 200 includes a unit cell array 205, column multiplexers 210 and 215, column amplifiers 220 and 225, a row multiplexer 230, control bias and timing circuitry 235, a digital-to-analog converter (DAC) 240, and a data output buffer 245. The unit cell array 205 includes an array of unit cells. In an aspect, each unit cell may include a detector and interface circuitry. The interface circuitry of each unit cell may provide an output signal, such as an output voltage or an output current, in response to a detector signal (e.g., detector current, detector voltage) provided by the detector of the unit cell. The output signal may be indicative of the magnitude of EM radiation received by the detector. The column multiplexer 215, column amplifiers 220, row multiplexer 230, and data output buffer 245 may be used to provide the output signals from the unit cell array 205 as a data output signal on a data output line 250. The data output signal may be an image formed of the pixel values for the image sensor assembly 200. In this regard, the column multiplexer 215, column amplifiers 220, row multiplexer 230, and data output buffer 245 may collectively provide an ROIC (or portion thereof) of the image sensor assembly 200.

The column amplifiers 225 may generally represent any column processing circuitry as appropriate for a given application (analog and/or digital), and is not limited to amplifier circuitry for analog signals. In this regard, the column amplifiers 225 may more generally be referred to as column processors in such an aspect. Signals received by the column amplifiers 225, such as analog signals on an analog bus and/or digital signals on a digital bus, may be processed according to the analog or digital nature of the signal. As an example, the column amplifiers 225 may include circuitry for processing digital signals. As another example, the column amplifiers 225 may be a path (e.g., no processing) through which digital signals from the unit cell array 205 traverses to get to the column multiplexer 215. As another example, the column amplifiers 225 may include an ADC for converting analog signals to digital signals. These digital signals may be provided to the column multiplexer 215.

Each unit cell may receive a bias signal (e.g., bias voltage, bias current) to bias the detector of the unit cell to compensate for different response characteristics of the unit cell attributable to, for example, variations in temperature, manufacturing variances, and/or other factors. For example, the control bias and timing circuitry 235 may generate the bias signals and provide them to the unit cells. By providing appropriate bias signals to each unit cell, the unit cell array 205 may be effectively calibrated to provide accurate image data in response to light (e.g., IR light) incident on the detectors of the unit cells.

In an aspect, the control bias and timing circuitry 235 may generate bias values, timing control voltages, and switch control voltages. In some cases, the DAC 240 may convert the bias values received as, or as part of, data input signal on a data input signal line 255 into bias signals (e.g., analog signals on analog signal line(s) 260) that may be provided to individual unit cells through the operation of the column multiplexer 210, column amplifiers 220, and row multiplexer 230. In another aspect, the control bias and timing circuitry 235 may generate the bias signals (e.g., analog signals) and provide the bias signals to the unit cells without utilizing the DAC 240. In this regard, some implementations do not include the DAC 240, data input signal line 255, and/or analog signal line(s) 260. In an embodiment, the control bias and timing circuitry 235 may be, may include, may be a part of, or may otherwise be coupled to the processing component 105 and/or image capture component 115 of FIG. 1.

In an embodiment, the image sensor assembly 200 may be implemented as part of an imaging system (e.g., 100). In addition to the various components of the image sensor assembly 200, the imaging system may also include one or more processors, memories, logic, displays, interfaces, optics (e.g., lenses, mirrors, beamsplitters), and/or other components as may be appropriate in various implementations. In an aspect, the data output signal on the data output line 250 may be provided to the processors (not shown) for further processing. For example, the data output signal may be an image formed of the pixel values from the unit cells of the image sensor assembly 200. The processors may perform operations such as non-uniformity correction (NUC), spatial and/or temporal filtering, and/or other operations. The images (e.g., processed images) may be stored in memory (e.g., external to or local to the imaging system) and/or displayed on a display device (e.g., external to and/or integrated with the imaging system).

By way of non-limiting examples, the unit cell array 205 may include 512×512 (e.g., 512 rows and 512 columns of unit cells), 1024×1024, 2048×2048, 4096×4096, 8192× 8192, and/or other array sizes. In some cases, the array size may have a row size (e.g., number of detectors in a row) different from a column size (e.g., number of detectors in a column). Examples of frame rates may include 30 Hz, 60 Hz, and 120 Hz. In an aspect, each unit cell of the unit cell array 205 may represent a pixel.

Figure 2B:
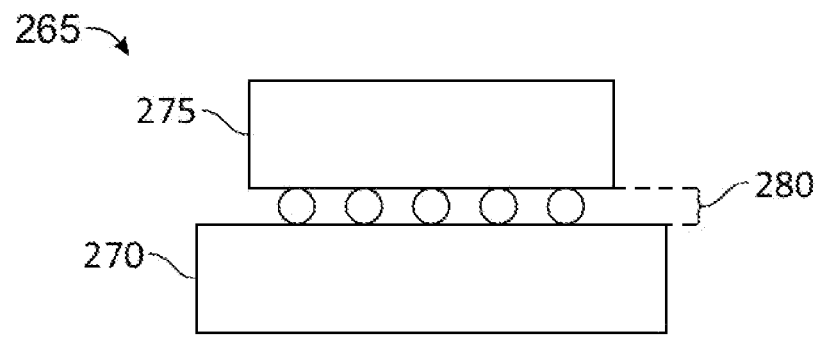
FIG. 2B illustrates an example image sensor assembly in accordance with one or more embodiments of the present disclosure.

In an embodiment, components of the image sensor assembly 200 may be implemented such that a detector array is hybridized to (e.g., bonded to) a readout circuit. For example, FIG. 2B illustrates an example image sensor assembly 265 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 265 may be, may include, or may be a part of, the image sensor assembly 200.

The image sensor assembly 265 includes a device wafer 270, a readout circuit 275, and contacts 280 to bond (e.g., mechanically and electrically bond) the device wafer 270 to the readout circuit 275. The device wafer 270 may include detectors (e.g., the unit cell array 205). The contacts 280 may bond the detectors of the device wafer 270 and the readout circuit 275. The contacts 280 may include conductive contacts of the detectors of the device wafer 270, conductive contacts of the readout circuit 275, and/or metallic bonds between the conductive contacts of the detectors and the conductive contacts of the readout circuit 275. For example, the contacts 280 may include contact layers formed on the detectors to facilitate coupling to the readout circuit 275. In one embodiment, the device wafer 270 may be bump-bonded to the readout circuit 275 using bonding bumps. The bonding bumps may be formed on the device wafer 270 and/or the readout circuit 275 to allow connection between the device wafer 270 and the readout circuit 275. In an aspect, hybridizing the device wafer 270 to the readout circuit 275 may refer to bonding the device wafer 270 (e.g., the detectors of the device wafer 270) to the readout circuit 725 to mechanically and electrically bond the device wafer 270 and the readout circuit 275.

Figure 3:
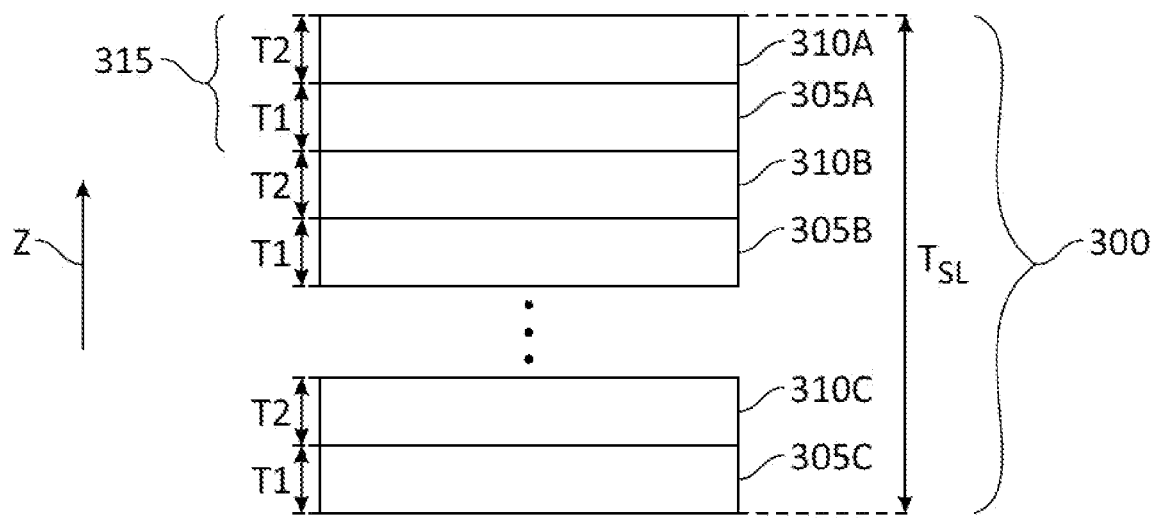
FIG. 3 illustrates an example superlattice structure in accordance with one or more embodiments of the present disclosure.

FIG. 3 illustrates an example superlattice structure 300 in accordance with one or more embodiments of the present disclosure. In some cases, the superlattice structure may be an SLS structure. The superlattice structure 300 includes layers 305A-C of a first semiconductor material and layers 310A-C of a second semiconductor material. In this regard, the superlattice structure 300 is formed of alternating layers of the first semiconductor material and the second semiconductor material. Each period of the superlattice structure 300 includes a layer of the first semiconductor material adjacent to a layer of the second semiconductor material. A period 315 is labeled. The period 315 includes the layer 305A adjacent to the layer 310A. For example, the layer 310A may be formed on (e.g., disposed on, epitaxially grown on) the layer 305A, or vice versa. The layers 305A-C and 310A-C may also be referred to as sub-layers of the superlattice structure 300.

The superlattice structure 300 has a thickness $T_{SL}$. Each layer of the first semiconductor material has a thickness $T_1$. Each layer of the second semiconductor material has a thickness $T_2$. The thickness $T_1$ may be referred to as a thickness of a layer of the first semiconductor material per period of the superlattice structure 300. Similarly, the thickness $T_2$ may be referred to as a thickness of a layer of the second semiconductor material per period of the second semiconductor material. The ellipses between the layers 305B and 310C indicate that one or more additional periods or no periods of alternating layers of first and second semiconductor material are provided between the layers 305B and 310C. In an embodiment, the superlattice structure 300 has a thickness $T_{SL}$ approximately between 0.3 µm and 5 µm. In an embodiment, each of the layers 305A-C and 310A-C has a thickness approximately between 5 Å and 100 Å. In FIG. 3, the thickness $T_1$ is lower than the thickness $T_2$. In other cases, the layers 310A-C may have the same thickness or be thicker than the layers 305A-C. For a given material composition of the first and second semiconductor materials, a bandgap (e.g., or equivalently the cut-off wavelength and cut-off frequency) of the superlattice structure 300 may be tuned by changing the thicknesses $T_1$ and/or $T_2$.

The superlattice structure 300 can be formed by selective deposition of thin layers of semiconductor materials in a stacked arrangement along the stacking direction (e.g., z-direction in FIG. 3). Periodic quantum wells create local confinement of carriers and an effective bandgap or cut-off wavelength dependent on the layer thicknesses. In some cases, the number of thin layers (e.g., number of periods) of the first and second semiconductor materials may depend on an absorption coefficient and carrier transport properties of an associated material system to effectuate a desired device quantum efficiency. The material system includes material composition of the first and second semiconductor material, associated layer dimensions, and additional layers (e.g., shown in FIG. 5) disposed on the superlattice structure 300 and below the superlattice structure 300. In an embodiment, the first semiconductor material may be InGaAs and the second semiconductor material may be GaAsSb, or vice versa. In this embodiment, the superlattice structure 300 may be referred to as an InGaAs/GaAsSb superlattice structure.

The layer 310A is adjacent to and in contact with the layer 305A, the layer 305A is adjacent to and in contact with the layer 310B, the layer 310B is adjacent to and in contact with the layer 305B, and so forth. In one case, the layer 305C of the superlattice 300 may be a bottommost layer of the superlattice structure 300 onto which the layer 310C is disposed. The layer 310B may be disposed on the layer 305B, the layer 305A may be disposed on the layer 310B, and the layer 310A may be disposed on the layer 305A. In one aspect, layers of the superlattice 300 may 20) be epitaxially grown. In this aspect, the layer 310C may be epitaxially grown on the layer 305C, the layer 310B may be epitaxially grown on the layer 305B, the layer 305A may be epitaxially grown on the layer 310B, and the layer 310A may be epitaxially grown on the layer 305A. The layers 305A-C and 310A-C may be formed using any suitable method. For example, each layer may be epitaxially grown using techniques such as molecular beam epitaxy (MBE), metal-organic chemical vapor deposition (MOCVD), and/or migration enhanced MOCVD (MEMOCVD). It is noted that the superlattice structure 300 of FIG. 3 illustrates one example superlattice structure. Other superlattice structure may be utilized. For example, although the superlattice 300 includes three periods, the superlattice 300 may include fewer (e.g., two) or more than three periods.

Figure 4:
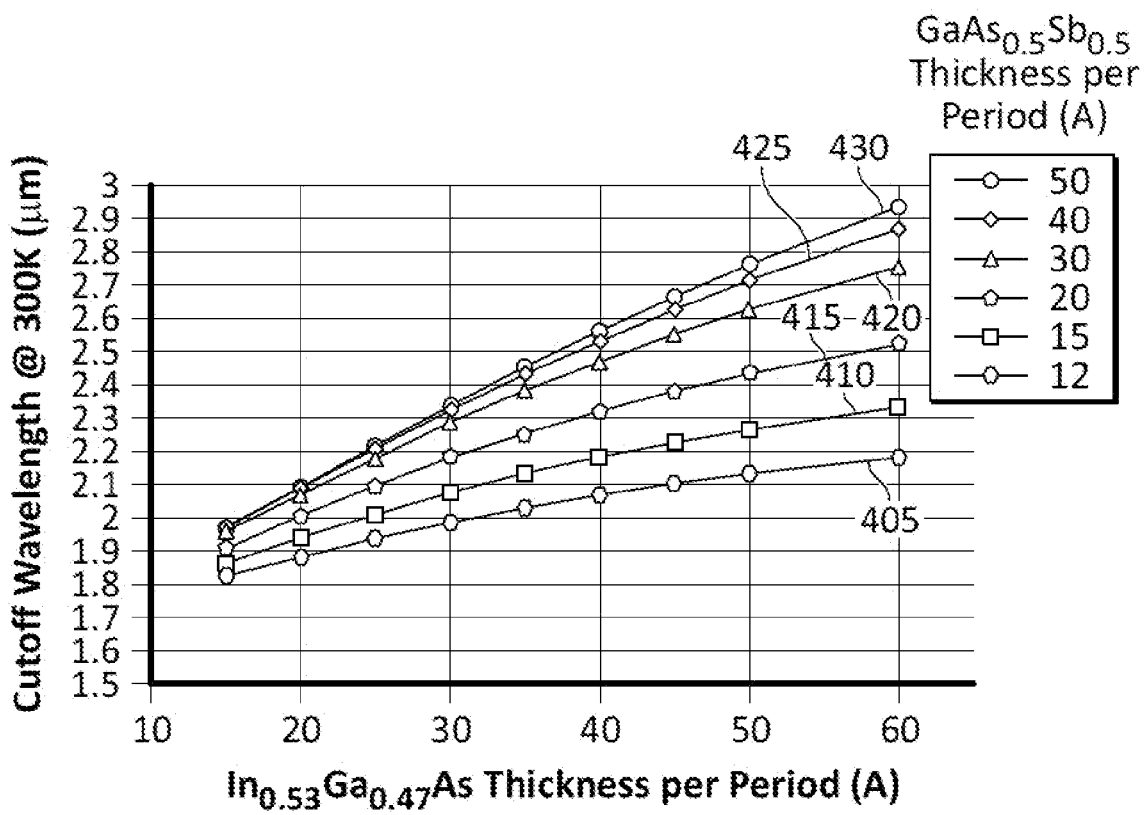
FIG. 4 illustrates a graph illustrating a cut-off wavelength as a function of sub-layer thicknesses of a superlattice structure in accordance with one or more embodiments of the present disclosure.

FIG. 4 illustrates a graph illustrating a cut-off wavelength at 300 K as a function of the thicknesses $T_1$ and $T_2$ of the superlattice structure 300 of FIG. 3 having alternating layers of the first and second semiconductor materials in accordance with one or more embodiments of the present disclosure. Each curve in the graph represents the cut-off wavelength as a function of the thickness $T_1$ for a given thickness $T_2$. Curves 405, 410, 415, 420, 425, and 430 in FIG. 4 illustrate the cut-off wavelength at 300 K as a function of the thickness $T_1$ for a thickness $T_2$ of 12 Å, 15 Å, 20 Å, 30 Å, 40 Å, and 50 Å, respectively, per period. In an embodiment, the superlattice structure 300 may have alternating InGaAs and GaAsSb layers, in which the layers 305A-C are InGaAs layers and the layers 310A-C are GaAsSb layers, or vice versa. The InGaAs layers may be $In_{0.53}Ga_{0.47}As$ layers and the GaAsSb layers may be $GaAs_{0.5}Sb_{0.5}$ layers.

As illustrated by the graph, as the thickness $T_1$ or $T_2$ increases, the cut-off wavelength increases (or equivalently the bandgap decreases). In some cases, the thicknesses $T_1$ and/or $T_2$ may be selected to achieve a desired cut-off wavelength. The graph illustrates combinations of the thicknesses $T_1$ and $T_2$ that can be utilized to implement a superlattice structure having a cut-off wavelength that can be tuned in the range of about 1.8 µm to about 3.0 µm, which may be utilized to facilitate e-SWIR detection. For example, for a cut-off wavelength of close to 2.3 µm, the thickness $T_2$ may be around 40 Å to 50 Å and the thickness $T_1$ may be around 29 Å.

Figure 5:
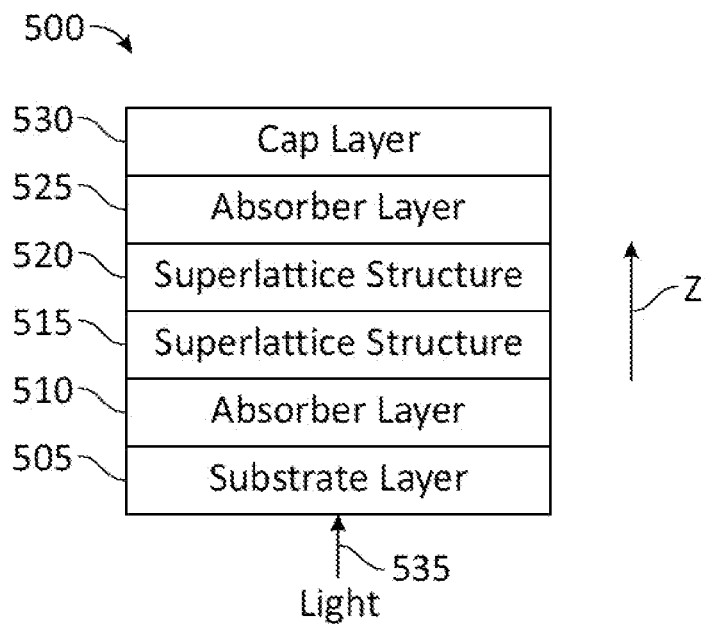
FIG. 5 illustrates an example stacked detector structure in accordance with one or more embodiments of the present disclosure.

FIG. 5 illustrates an example stacked detector structure 500 in accordance with one or more embodiments of the present disclosure. Not all of the depicted components (e.g., layers) may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the stacked detector structure 500 provides a detector (e.g., a pixel) of an FPA.

The stacked detector structure 500 includes a substrate layer 505, an absorber layer 510, a superlattice structure 515, a superlattice structure 520, an absorber layer 525, and a cap layer 530. In an embodiment, the absorber layer 510, the superlattice structure 515, the superlattice structure 520, the absorber layer 525, and the cap layer 530 each have materials having the same or similar lattice constant as the substrate layer 505. In some aspects, the superlattice structure 515 may be a superlattice-based absorber layer and/or the superlattice structure 520 may be a superlattice-based graded gap layer.

The substrate layer 505 provides an appropriate material on which the absorber layer 510 may be epitaxially grown. The substrate layer 505 provides a window to receive light 535. In an aspect, the substrate layer 505 has a wide bandgap (or equivalently a low cut-off wavelength). In an embodiment, the substrate layer 505 may prevent dark current while allowing transport of carriers. The absorber layer 510 is disposed on (e.g., epitaxially grown on) the substrate layer 505. The absorber layer 510 may absorb components of the light 535 received via the substrate layer 505 that have a wavelength below the cut-off wavelength of the absorber layer 510. The absorber layer 525 is disposed on the superlattice structure 520.

In an embodiment, the substrate layer 505 may have a cut-off wavelength of around 0.9 μm such that components of the light 535 having a wavelength below this cut-off wavelength is absorbed by the substrate layer 505 while the remaining components of the light 535 may be transmitted through the substrate layer 505 to be received by the absorber layer 510. The absorber layer 510 may have a cut-off wavelength of around 1.7 μm. The absorber layer 510 may absorb components of the light 535 having a wavelength between around 0.9 μm and 1.7 μm, since components having a wavelength less than around 0.9 μm are absorbed by the substrate layer 505.

The superlattice structure 515 is disposed on (e.g., epitaxially grown on) the absorber layer 510. The superlattice structure 515 may also be utilized as an absorber layer of the stacked detector structure 500. The superlattice structure 515 may be an SLS structure. The superlattice structure 515 includes alternating layers of semiconductor materials that provide periodic quantum wells that create local confinement of carriers and an effective cut-off wavelength dependent on material composition and layer thicknesses. In an aspect, the superlattice structure 515 may effectively extend the cut-off wavelength of the absorber layer 510. In this regard, by providing the superlattice structure 515 between the absorber layers 510 and 525, the cut-off wavelength collectively provided by the superlattice structure 515, the absorber layer 510, and the absorber layer 525 may be higher than the cut-off wavelength provided by the absorber layer 510 and the absorber layer 525 (e.g., without the superlattice structure 515). In some aspects, a thickness of the superlattice structure 515 may be selected to provide a desired quantum efficiency. For example, a larger thickness of the superlattice structure 515 is generally associated with more light (e.g., photons) being absorbed by the superlattice structure 515 and higher quantum efficiency, but may exhibit issues associated with utilizing more material (e.g., higher costs, more defects) to form a thicker superlattice structure.

The superlattice structure 520 is disposed on (e.g., epitaxially grown on) the superlattice structure 515. The superlattice structure 520 may be an SLS structure. The superlattice structure 520 may be utilized to provide a graded bandgap profile that facilitates transport of photogenerated carriers. In this regard, the superlattice structure 520 may be utilized to implement tunability in conduction and valence band edges to facilitate band alignment relative to a material system utilized for the stacked detector structure 500. In some cases, the superlattice structure 520 may mitigate dark current. In this regard, a thickness of the superlattice structure 520 may be selected to allow low dark current performance.

The absorber layer 525 is disposed on (e.g., epitaxially grown on) the superlattice structure 520. The cap layer 530 is disposed on (e.g., epitaxially grown on) the absorber layer 525. The cap layer 530 may be utilized to provide passivation and suppress leakage current and dark current. In an embodiment, the stacked detector structure 500 provides a detector (e.g., a pixel) of an FPA, and the cap layer 530 may be connected to cap layers of other detectors of the FPA. Suppression of leakage current prevents signal leakage between detectors of the FPA.

Figure 6:
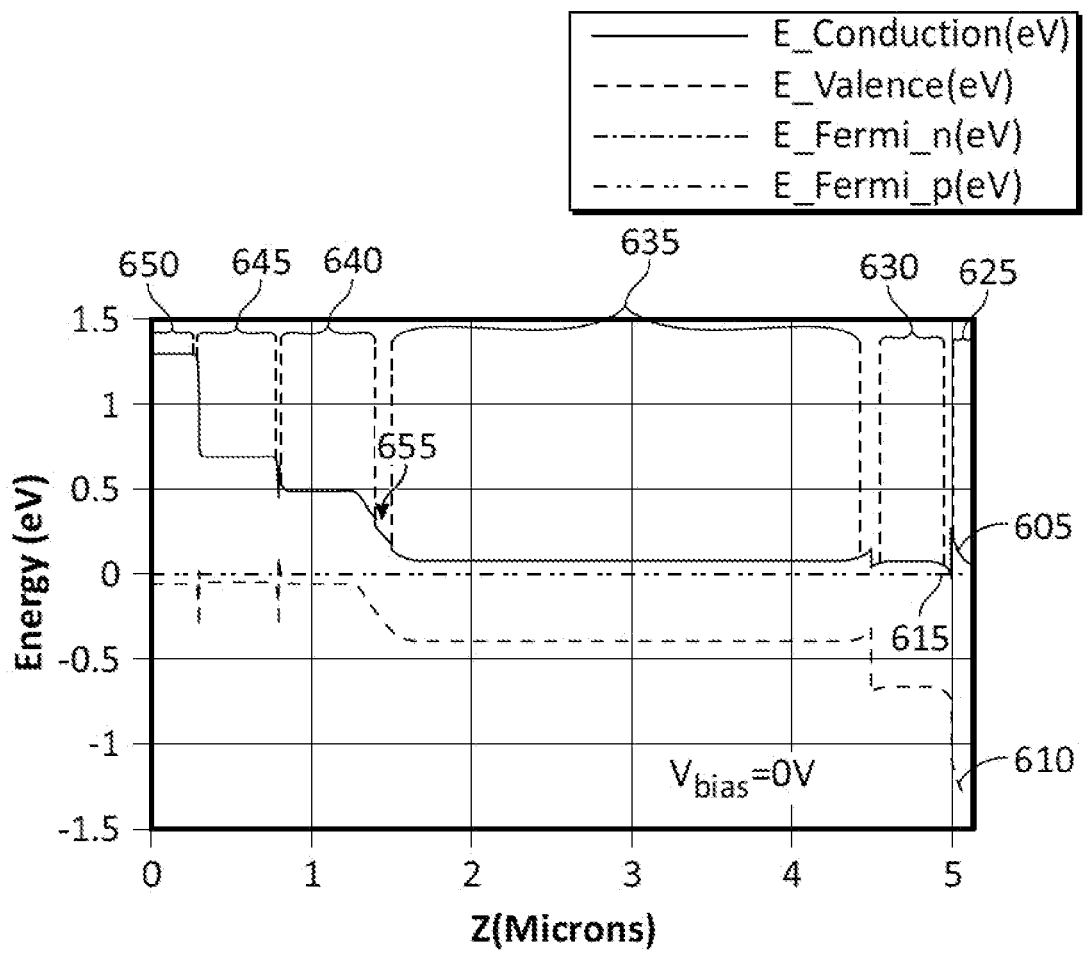
FIG. 6 illustrates an example energy band diagram associated with a stacked detector structure in accordance with one or more embodiments of the present disclosure.

FIG. 6 illustrates an example energy band diagram associated with the stacked detector structure 500 of FIG. 5 in accordance with one or more embodiments of the present disclosure. The energy band diagram shows a conduction band edge 605 (e.g., denoted as E_Conduction or CB), a valence band edge 610 (e.g., denoted as E_Valence or VB), and Fermi energy level 615 as a function of a position z, where z=0 represents the topmost surface of the layer 530. The Fermi energy level 615 includes the $E_{fp}$ and $E_{fn}$ energy levels (e.g., also denoted as E_Fermi_p and E_Fermi_n, respectively). The $E_{fp}$ and $E_{fn}$ energy levels coincide in FIG. 6. In an embodiment, portions 625, 630, 635, 640, 645, and 650 of the energy band diagram are associated with an energy profile associated with the substrate layer 505, the absorber layer 510, the superlattice structure 515, the superlattice structure 520, the absorber layer 525, and the cap layer 530, respectively. In an aspect, the stacked detector structure 500 exhibits the energy band diagram of FIG. 6 when under zero applied bias.

In an embodiment, a continuous portion (e.g., formed of a series of contiguous layers) of the stacked detector structure may have p-type conductivity, whereas a remaining continuous portion of the stacked detector structure may have n-type conductivity. The stacked detector structure 500 may be coupled to a readout circuit (e.g., ROIC) via a contact layer formed on one of the p-type layers of the stacked detector structure 500 and a contact layer formed on one of the n-type layers of the stacked detector structure 500.

Figure 7:
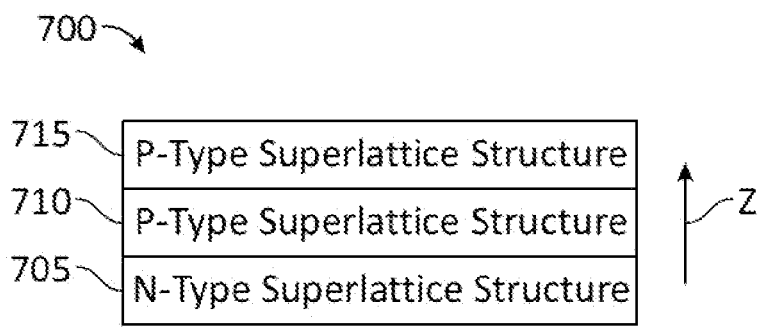
FIG. 7 illustrates an example graded-gap superlattice structure in accordance with one or more embodiments of the present disclosure.

FIG. 7 illustrates an example graded-gap superlattice structure 700 in accordance with one or more embodiments of the present disclosure. The graded-gap superlattice structure 700 may be an SLS. The graded-gap superlattice structure 700 includes superlattice structures 705, 710, and 715. The superlattice structure 710 is disposed on the superlattice structure 705, and the superlattice structure 715 is disposed on the superlattice structure 710. The superlattice structure 705 may be disposed on the superlattice structure 515. Although the graded-gap superlattice structure 700 includes three superlattice structures, a graded-gap superlattice structure may include more or fewer than three superlattice structures.

Table 1 shows an example layer composition and doping of the stacked detector structure 500 in which the superlattice structure 520 is implemented using the graded-gap superlattice structure 700. As an example, in Table 1, a composition of 40 Å InGaAs/30 Å GaAsSb represents a superlattice having alternating sub-layers of 40 Å InGaAs and 30 Å GaAsSb. In an embodiment, Table 1 provides layer composition and doping similar to the material system associated with the energy band diagram of FIG. 6. In an aspect, example cut-off wavelengths associated with various thicknesses of the sub-layers are provided in FIG. 4.

TABLE 1

Example layer composition and doping of stacked detector structure

| Layer # | Description | Thickness (μm) | Composition | Conductivity Type | Dopant Concentration (cm$^{-3}$) |
|---|---|---|---|---|---|
| 1 | Cap layer 530 | 0.3 | InP | p | $1.0 \times 10^{18}$ |
| 2 | Absorber layer 525 | 0.5 | In$_{0.53}$Ga$_{0.47}$As | p | $1.0 \times 10^{18}$ |
| 3 | Superlattice structure 715 | 0.5 | 30 Å InGaAs/ 30 Å GaAsSb | p | $1.0 \times 10^{17}$ |
| 4 | Superlattice structure 710 | 0.1 | 30 Å InGaAs/ 30 Å GaAsSb | n | $1.0 \times 10^{15}$ |
| 5 | Superlattice structure 705 | 0.1 | 40 Å InGaAs/ 30 Å GaAsSb | n | $1.0 \times 10^{15}$ |
| 6 | Superlattice structure 515 | 3 | 50 Å InGaAs/ 30 Å GaAsSb | n | $1.0 \times 10^{16}$ |
| 7 | Absorber layer 510 | 0.5 | In$_{0.53}$Ga$_{0.47}$As | n | $1.0 \times 10^{16}$ |
| 8 | Substrate layer 505 | 0.1 | InP | n | $5.0 \times 10^{16}$ |

In some aspects, a thickness of the superlattice structure 515 may be selected to provide a desired quantum efficiency. For example, a larger thickness of the superlattice structure 515 is generally associated with more light (e.g., photons) being absorbed by the superlattice structure 515 and higher quantum efficiency, but may exhibit issues associated with utilizing more material (e.g., higher costs, more defects) to form a thicker superlattice structure. Thicknesses of the superlattice structures 705, 710, and 715 may be selected to allow low dark current performance.

With reference to Table 1 and FIGS. 6 and 7, a p-n junction 655 is formed at an interface of the superlattice structure 715 (e.g., p-type) and the superlattice structure 710 (e.g., n-type). As one example, the p-n junction 655 may be formed by a p-type 30 Å GaAsSb sub-layer of the superlattice structure 715 and an n-type 30 Å InGaAs sub-layer of the superlattice structure 710. As another example, the p-n junction 655 may be formed by a p-type 30 Å GaAsSb sub-layer (or p-type 30 Å InGaAs sub-layer) of the superlattice structure 715 and an n-type 30 Å GaAsSb sub-layer (or n-type 30 Å InGaAs sub-layer) of the superlattice structure 710. In an aspect, the p-n junction 655 and absorber (e.g., the superlattice structure 515) show little to no band discontinuity and thus facilitate minority carriers (e.g., minority holes) to cross the p-n junction 655 at close to zero applied bias. A tunable energy gap allows a wider energy gap superlattice to be used at the p-n junction 655 to minimize G-R current and can be graded to a smaller energy gap absorber. The superlattice structures 705, 710, and 715 may have bandgaps graded such that the superlattice structure 715 has a wider bandgap than the superlattice structure 710, the superlattice structure 710 has a wider bandgap than the superlattice structure 705, and the superlattice structure 705 has a wider bandgap than the superlattice structure 515. With regard to the other layers, the substrate layer 505 may have a wider bandgap than the absorber layer 510, the absorber layer 510 may have a wider bandgap than the superlattice structure 515 (e.g., the superlattice-based absorber layer), the cap layer 530 may have a wider bandgap than the absorber layer 525, and the absorber layer 525 may have a wider bandgap than the superlattice structure 515.

As such, the p-n junction 655 is created with a larger bandgap material and then graded to a narrower bandgap material. A depletion region associated with the p-n junction 655 may be positioned mostly in the wider bandgap material as opposed to the narrower bandgap material to avoid higher G-R current associated with the narrower bandgap material. A graded bandgap may be provided to reduce the G-R current created in the depletion region. In addition, a transition from p-type conductivity to n-type conductivity associated with the p-n junction 655 may be positioned to minimize dark current effects related to the bandgap. With respect to FIG. 6, alignment of the valence band at positions left of the p-n junction facilitates flow of holes (e.g., by avoiding of a potential that impedes or prohibits holes from being transported across the depletion region) to the contact layer on the p-side (e.g., p-contact layer), whereas alignment of the conduction band right of the p-n junction facilitates flow of electrons to the contact layer on the n-side (e.g., n-contact layer). It is noted that sub-layers of superlattice structures may have different conductivity type from that shown in Table 1 and FIG. 7. As one example, with reference to Table 1, layers 3 through 8, inclusive, may have n-type conductivity. As another example, with reference to Table 1, layers 1 through 5, inclusive, may have p-type conductivity.

An example n-type dopant may be sulfur. An example p-type dopant may be zinc. In an aspect, the dopants may be applied during epitaxial growth (e.g., as part of epitaxial growth) or after epitaxial growth. In some cases, zinc dopants may be applied after epitaxial growth. For example, a via may be formed in the cap layer 530, the absorber layer 525, the superlattice structure 715, and the superlattice structure 710. A zinc diffusion process may then be performed to form a p-type well having zinc as dopants in the cap layer 530, the absorber layer 525, the superlattice structure 715, and the superlattice structure 710. In some cases, absent the zinc dopants, the cap layer 530, the absorber layer 525, the superlattice structure 715, and the superlattice structure 710 may be intrinsically n-type, such that regions surrounding the p-type zinc well are n-type.

Figure 8:
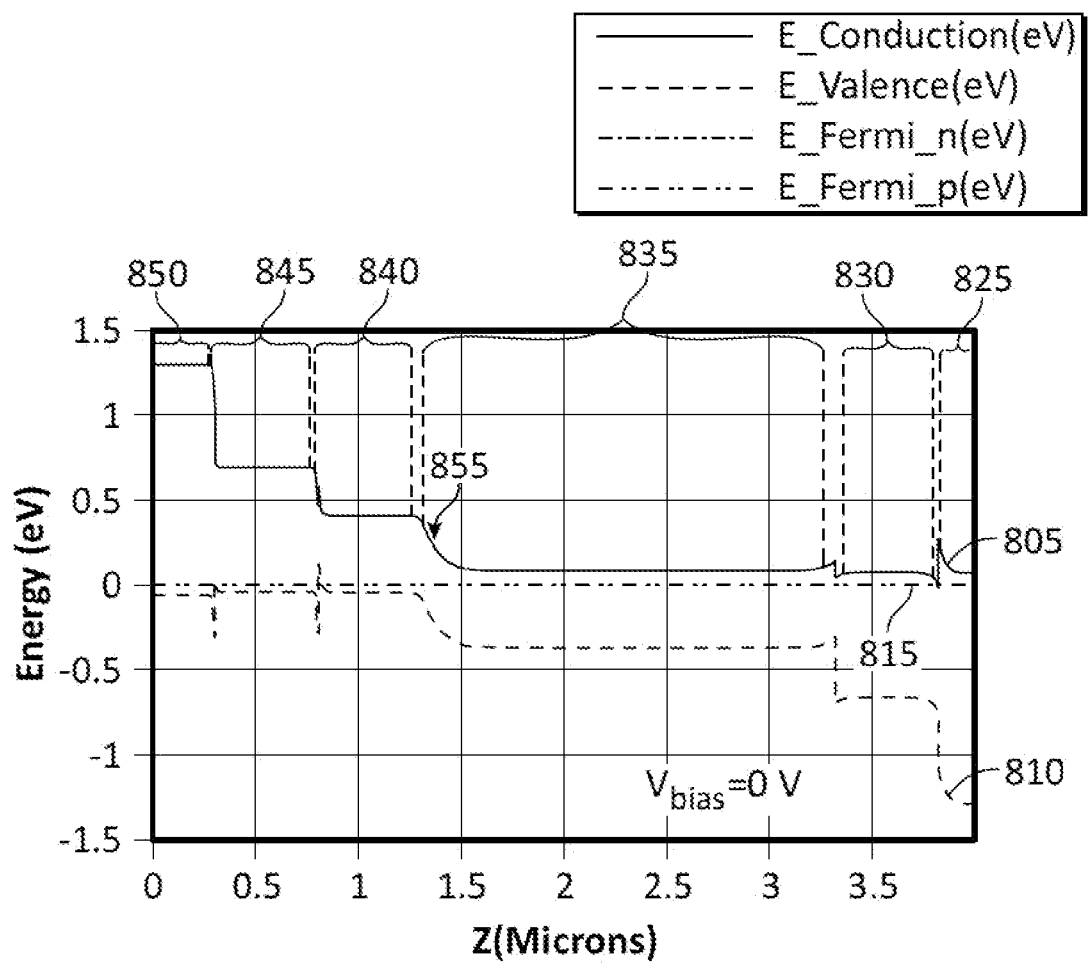
FIG. 8 illustrates another example energy band diagram associated with a stacked detector structure in accordance with one or more embodiments of the present disclosure.

In some embodiments, the superlattice structure 520 includes a single superlattice structure. FIG. 8 illustrates another example energy band diagram associated with the stacked detector structure 500 of FIG. 5 in accordance with one or more embodiments of the present disclosure. The description of FIGS. 6 and 7 generally applies to FIG. 8, with examples of differences and other description provided herein. The energy band diagram shows a conduction band edge 805, a valence band edge 810, and Fermi energy level 815 as a function of a position z, where z=0 represents the topmost surface of the layer 530. The $E_{fp}$ and $E_{fn}$ energy levels coincide in FIG. 8. In an embodiment, portions 825, 830, 835, 840, 845, and 850 of the energy band diagram are associated with an energy profile associated with the substrate layer 505, the absorber layer 510, the superlattice structure 515, the superlattice structure 520, the absorber layer 525, and the cap layer 530, respectively. In an aspect, the stacked detector structure 500 exhibits the energy band diagram of FIG. 8 when under zero applied bias.

Table 2 shows layer composition and doping of an example of the stacked detector structure 500 in which the superlattice structure 520 is implemented using a single superlattice structure. In an embodiment, Table 2 provides layer composition and doping similar to the material system associated with the energy band diagram of FIG. 8.

TABLE 2

Example layer composition and doping of stacked detector structure

| Layer # | Description | Thickness (μm) | Composition | Conductivity Type | Dopant Concentration (cm$^{-3}$) |
|---|---|---|---|---|---|
| 1 | Cap layer 530 | 0.3 | InP | p | $1.0 \times 10^{18}$ |
| 2 | Absorber layer 525 | 0.5 | $In_{0.53}Ga_{0.47}As$ | p | $1.0 \times 10^{18}$ |
| 3 | Superlattice structure 520 | 0.5 | 60 Å InGaAs/ 30 Å GaAsSb | p | $1.0 \times 10^{17}$ |
| 4 | Superlattice structure 515 | 2 | 60 Å InGaAs/ 30 Å GaAsSb | n | $1.0 \times 10^{16}$ |
| 5 | Absorber layer 510 | 0.5 | $In_{0.53}Ga_{0.47}As$ | n | $1.0 \times 10^{16}$ |
| 6 | Substrate layer 505 | 0.1 | InP | n | $5.0 \times 10^{16}$ |

With reference to Table 2 and FIG. 8, a p-n junction 855 is formed at an interface of the superlattice structure 520 (e.g., p-type) and the superlattice structure 515 (e.g., n-type). For example, the p-n junction 855 may be formed by a p-type 30 Å GaAsSb sub-layer of the superlattice structure 520 and an n-type 60 Å InGaAs sub-layer of the superlattice structure 515. In some cases, since the superlattice structures 515 and 520 have the same material composition, the superlattice structures 515 and 520 may be referred to as providing a homojunction.

Figure 9:
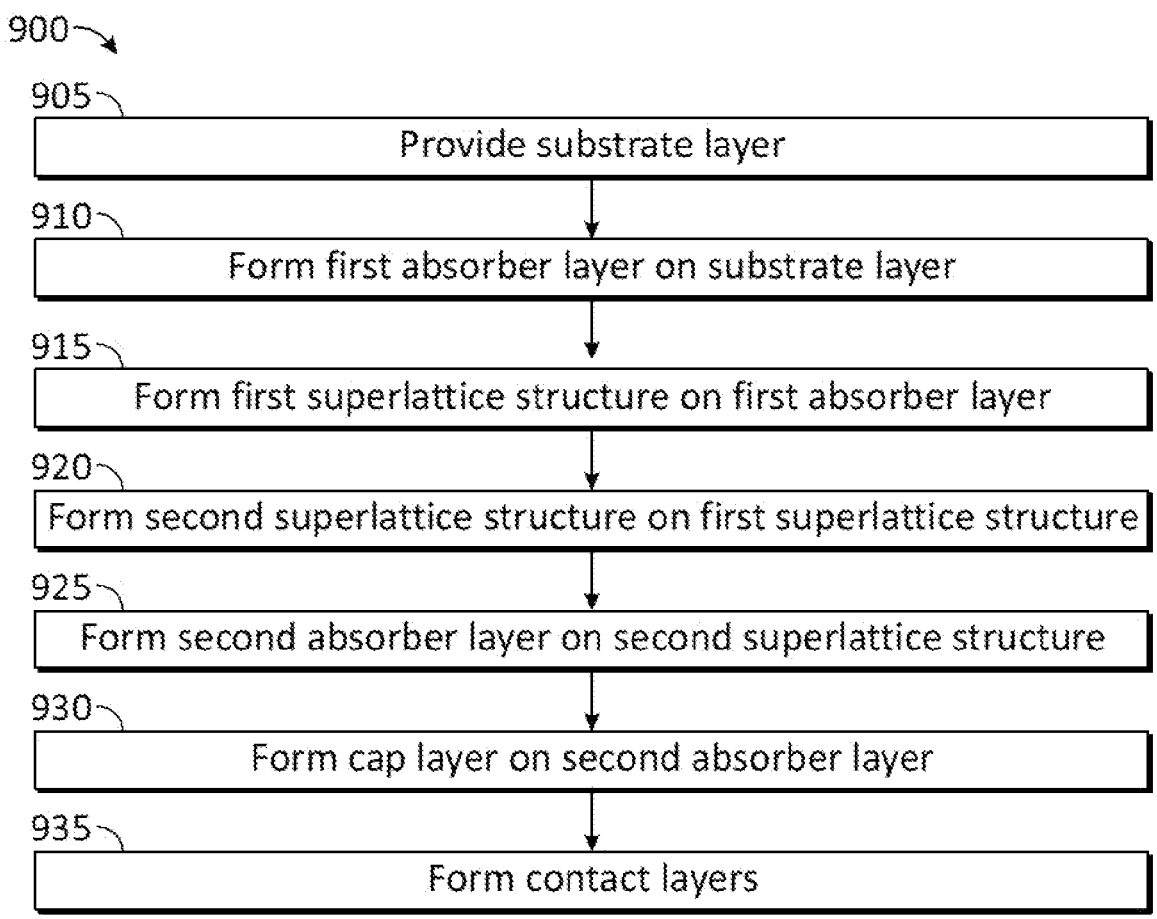
FIG. 9 illustrates a flow diagram of an example process for forming an imaging device in accordance with one or more embodiments of the present disclosure.

FIG. 9 illustrates a flow diagram of an example process 900 for forming (e.g., fabricating) an imaging device in accordance with one or more embodiments of the present disclosure. The imaging device includes a detector array and a readout circuit. In an embodiment, the detector array includes an array of superlattice-based detectors. For explanatory purposes, the process 900 is primarily described herein with reference to an imaging device that includes the stacked detector structure 500 of FIG. 5. However, the process 900 can be performed in relation to other imaging devices. Note that one or more operations in FIG. 9 may be combined, omitted, and/or performed in a different order as desired.

At block 905, the substrate layer 505 is provided. The substrate layer 505 may have a first conductivity type (e.g., n-type conductivity). As an example, the substrate layer 505 may be an InP layer doped with an n-type dopant such as sulfur. An example thickness of the substrate layer 505 is approximately between 0.05 μm and 0.2 μm. At block 910, the absorber layer 510 is formed on the substrate layer 505. The absorber layer 510 may have the first conductivity type. In an aspect, the absorber layer 510 may be epitaxially grown on the substrate layer 505. As an example, the absorber layer 510 may be an InGaAs layer (e.g., an $In_{0.53}Ga_{0.47}As$ layer) doped with an n-type dopant. An example thickness of the absorber layer 510 is approximately between 0.3 μm and 0.7 μm.

At block 915, the superlattice structure 515 (e.g., the superlattice-based absorber layer) is formed on the absorber layer 510. In an embodiment, the superlattice structure 515 may include alternating InGaAs and GaAsSb sub-layers. In this regard, the superlattice structure 515 may include a plurality of periods, with each period including an InGaAs sub-layer adjacent to a GaAsSb sub-layer. In an aspect, the superlattice structure 515 may be epitaxially grown on the absorber layer 510. In some cases, a GaAsSb sub-layer of one of the periods of the superlattice structure 515 is formed on (e.g., epitaxially grown on) the absorber layer 510. In other cases, an InGaAs sub-layer of one of the periods of the superlattice structure 515 is formed on (e.g., epitaxially grown on) the absorber layer 510. An example thickness of the superlattice structure 515 is approximately between 1.5 μm and 3.5 μm.

At block 920, the superlattice structure 520 is formed on the superlattice structure 515. In some aspects, each sub-layer of the superlattice structures 515 and 520 may have a thickness approximately between 20 Å and 70 Å. In one aspect, the superlattice structure 520 includes at least a first superlattice structure having a first plurality of periods and a second superlattice structure having a second plurality of periods. Each of the first plurality of periods and the second plurality of periods may include alternating InGaAs and GaAsSb sub-layers, such that an InGaAs sub-layer is adjacent to a GaAsSb sub-layer. The first plurality of periods may be formed on (e.g., epitaxially grown on) the superlattice structure 515, and the second plurality of periods may be formed on (e.g., epitaxially grown on) the first plurality of periods. The first plurality of periods may have the first conductivity type, and the second plurality of periods may have a second conductivity type (e.g., p-type). For example, the first plurality of periods may have an n-type dopant and the second plurality of periods may have a p-type dopant.

In some cases, the first and second plurality of periods provide a graded bandgap. To provide the graded bandgap, the first plurality of periods may be associated with a wider bandgap than the superlattice structure 515, and the second plurality of periods may be associated with a wider bandgap than the first plurality of periods. A p-n junction may be formed at an interface within the superlattice structure 520 or at an interface between the superlattice structure 520 and the superlattice structure 515. As one example, the p-n junction may be formed by an InGaAs sub-layer of the first plurality of periods and a GaAsSb sub-layer of the second plurality of periods.

In another aspect, the superlattice structure 520 includes a single superlattice structure. The single superlattice structure may have the second conductivity type (e.g., p-type). As one example, the p-n junction may be formed by an InGaAs sub-layer of the superlattice structure 520 and a GaAsSb sub-layer of the superlattice structure 515.

At block 925, the absorber layer 525 is formed on the superlattice structure 520. The absorber layer 525 may have the second conductivity type. In an aspect, the absorber layer 525 may be epitaxially grown on the superlattice structure 520. As an example, the absorber layer 525 may be an InGaAs layer (e.g., an $In_{0.53}Ga_{0.47}As$ layer) doped with a p-type dopant. An example thickness of the absorber layer 525 is approximately between 0.3 µm and 0.7 µm. At block 930, the cap layer 530 is formed on the absorber layer 525. The absorber layer 525 may have the second conductivity type. In an aspect, the cap layer 530 may be epitaxially grown on the absorber layer 525. As an example, the cap layer 530 may be an InP layer doped with a p-type dopant. An example thickness of the cap layer 530 is approximately between 0.2 µm and 0.4 µm. In an aspect, zinc dopants may be applied to the cap layer 530, the absorber layer 525, and at least a portion of the superlattice structure 520 after epitaxial growth. After epitaxial growth, a via may be formed in the cap layer 530, the absorber layer 525, and the portion of the superlattice structure 520 and a zinc diffusion process performed to form a p-type well having zinc as dopants.

At block 935, a contact layer is formed on each of a p-side of the stacked detector structure 500 and an n-side of the stacked detector structure 500. The contact layers may allow coupling of the stacked detector structure 500 with a readout circuit (e.g., ROIC), such as the readout circuit 170 of FIG. 1. During operation of the stacked detector structure 500, incident light (e.g., the light 535) is received by the substrate layer 505. The stacked detector structure 500 may detect the incident light (e.g., representing image data) and generate signals indicative of the incident light. The signals may be read out by a readout circuit. In an embodiment, the stacked detector structure 500 provides a detector (e.g., a pixel) of an FPA, and the cap layer 530 may be coupled to cap layers of other detectors of the FPA. Suppression of leakage current prevents signal leakage between detectors of the FPA. The cap layer 530 may be utilized to provide passivation and suppress leakage current and dark current.

It is noted that dimensional aspects (e.g., sub-layer thicknesses, layer thicknesses, and superlattice thicknesses) and doping concentrations provided above, such as those provided in Tables 1 and 2, are by way of non-limiting example and are generally application dependent. Furthermore, as would be appreciated, such dimensional aspects and doping concentrations are generally nominal values and are associated with dimensional tolerances and doping tolerances, respectively.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing description is not intended to limit the present disclosure to the precise forms or particular fields of use disclosed. Embodiments described above illustrate but do not limit the invention. It is contemplated that various alternate embodiments and/or modifications to the present invention, whether explicitly described or implied herein, are possible in light of the disclosure. Accordingly, the scope of the invention is defined only by the following claims.

What is claimed is:

1. An infrared detector comprising:
    a first superlattice structure comprising a first plurality of periods, wherein each of the first plurality of periods comprises:
        a first sub-layer comprising a first semiconductor material; and
        a second sub-layer adjacent to the first sub-layer, wherein the second sub-layer comprises a second semiconductor material; and
    a second superlattice structure disposed on the first superlattice structure, wherein the second superlattice structure comprises a second plurality of periods, and wherein each of the second plurality of periods comprises:
        a third sub-layer comprising a third semiconductor material; and
        a fourth sub-layer adjacent to the third sub-layer, wherein the fourth sub-layer comprises a fourth semiconductor material,
    wherein the second plurality of periods is associated with a wider bandgap than the first plurality of periods, and wherein a p-n junction is formed at an interface within the second superlattice structure or at an interface between the first and second superlattice structures.

2. The infrared detector of claim 1, wherein the first superlattice structure has a thickness greater than a thickness of the second superlattice structure, wherein each of the first sub-layer, the second sub-layer, the third sub-layer, and the fourth sub-layer has a thickness approximately between 20 Å and 70 Å, wherein the infrared detector is configured to detect infrared wavelengths approximately between 1 µm and 3 µm, and wherein the infrared detector is part of a focal plane array (FPA).

3. The infrared detector of claim 1, wherein the second superlattice structure further comprises a third plurality of periods disposed on the second plurality of periods, and wherein each of the third plurality of periods comprises:
    a fifth sub-layer comprising a fifth semiconductor material; and
    a sixth sub-layer adjacent to the fifth sub-layer, wherein the sixth sub-layer comprises a sixth semiconductor material,
    wherein:
        the third plurality of periods is associated with a wider bandgap than the second plurality of periods.

4. The infrared detector of claim 3, wherein the p-n junction is formed by the sixth sub-layer of one of the third plurality of periods and the third sub-layer of one of the second plurality of periods.

5. The infrared detector of claim 3, wherein:
the first semiconductor material, the third semiconductor material, and the fifth semiconductor material comprise indium gallium arsenide (InGaAs); and
the second semiconductor material, the fourth semiconductor material, and the sixth semiconductor material comprise gallium arsenide antimonide (GaAsSb).

6. The infrared detector of claim 3, wherein the third semiconductor material and the fifth semiconductor material comprise the same semiconductor material, and wherein the third sub-layer of each period of the second plurality of periods has a thickness different from the fifth sub-layer of each period of the third plurality of periods.

7. The infrared detector of claim 3, wherein the first sub-layer of each period of the first plurality of periods has a thickness greater than a thickness of the second sub-layer of each period of the first plurality of periods, a thickness of each of the third and the fourth sub-layer of each period of the second plurality of periods, and a thickness of each of the fifth and the sixth sub-layer of each period of the third plurality of periods.

8. The infrared detector of claim 1, wherein the p-n junction is formed by the fourth sub-layer of one of the second plurality of periods and the first sub-layer of one of the first plurality of periods.

9. The infrared detector of claim 1, further comprising:
a substrate layer configured to receive electromagnetic radiation, wherein the substrate layer has a first conductivity type;
a first absorber layer disposed on the substrate layer, wherein the first absorber layer has the first conductivity type, and wherein the first superlattice structure is disposed on the first absorber layer;
a second absorber layer disposed on the second superlattice structure, wherein the second absorber layer has a second conductivity type opposite of the first conductivity type; and
a cap layer disposed on the second absorber layer, wherein the cap layer has the second conductivity type,
wherein:
the first superlattice structure has the first conductivity type, and
at least a portion of the second superlattice structure has the second conductivity type.

10. The infrared detector of claim 9, wherein:
the substrate layer and the cap layer each comprise indium phosphide (InP); and
the first absorber layer and the second absorber layer each comprise indium gallium arsenide (InGaAs).

11. The infrared detector of claim 10, wherein the first absorber layer and the second absorber layer each comprise $In_{0.53}Ga_{0.47}As$.

12. The infrared detector of claim 9, further comprising:
a first contact layer formed on a portion of the infrared detector associated with the first conductivity type; and
a second contact layer formed on a portion of the infrared detector associated with the second conductivity type, wherein the first contact layer and the second contact layer are configured to be coupled to a readout circuit to allow readout of a signal indicative of the electromagnetic radiation.

13. The infrared detector of claim 1, wherein the first semiconductor material and the third semiconductor material comprise the same semiconductor material, and wherein a thickness of the first sub-layer of each period of the first plurality of periods is different from a thickness of the third sub-layer of each period of the second plurality of periods.

14. A method comprising:
forming a first superlattice structure comprising a first plurality of periods, wherein each of the first plurality of periods comprises:
a first sub-layer comprising a first semiconductor material; and
a second sub-layer formed on the first sub-layer, wherein the second sub-layer comprises a second semiconductor material; and
forming a second superlattice structure on the first superlattice structure, wherein the second superlattice structure comprises a second plurality of periods, wherein each of the second plurality of periods comprises:
a third sub-layer comprising a third semiconductor material; and
a fourth sub-layer formed on the third sub-layer, wherein the fourth sub-layer comprises a fourth semiconductor material,
wherein the second plurality of periods is associated with a wider bandgap than the first plurality of periods, and wherein a p-n junction is formed at an interface within the second superlattice structure or at an interface between the first and second superlattice structures.

15. The method of claim 14, wherein the forming the second superlattice structure comprises epitaxially growing the second superlattice structure on the first superlattice structure, and wherein the p-n junction is formed by the fourth sub-layer of one of the second plurality of periods and the first sub-layer of one of the first plurality of periods.

16. The method of claim 14, wherein the second superlattice structure further comprises a third plurality of periods formed on the second plurality of periods, and wherein each of the third plurality of periods comprises:
a fifth sub-layer comprising a fifth semiconductor material; and
a sixth sub-layer formed on the fifth sub-layer, wherein the sixth sub-layer comprises a sixth semiconductor material,
wherein:
the third plurality of periods is associated with a wider bandgap than the second plurality of periods.

17. The method of claim 16, wherein the p-n junction is formed by the sixth sub-layer of one of the third plurality of periods and the third sub-layer of one of the second plurality of periods.

18. The method of claim 16, wherein:
the first semiconductor material, the third semiconductor material, and the fifth semiconductor material comprise indium gallium arsenide (InGaAs); and
the second semiconductor material, the fourth semiconductor material, and the sixth semiconductor material comprise gallium arsenide antimonide (GaAsSb).

19. The method of claim 14, further comprising:
providing a substrate layer for receiving electromagnetic radiation, wherein the substrate layer has a first conductivity type;
forming a first absorber layer on the substrate layer, wherein the first absorber layer has the first conductivity type, and wherein the first superlattice structure is formed on the first absorber layer;

forming a second absorber layer on the second superlattice structure, wherein the second absorber layer has a second conductivity type opposite of the first conductivity type; and forming a cap layer on the second absorber layer, wherein the cap layer has the second conductivity type, wherein:
  the first superlattice structure has the first conductivity type, and
  at least a portion of the second superlattice structure has the second conductivity type.

20. The method of claim 19, wherein:
the substrate layer and the cap layer each comprise indium phosphide (InP); and
the first absorber layer and the second absorber layer each comprise indium gallium arsenide (InGaAs).

* * * * *

UNITED STATES PATENT AND TRADEMARK OFFICE
CERTIFICATE OF CORRECTION

PATENT NO. : 12,057,465 B2
APPLICATION NO. : 17/344210
DATED : August 6, 2024
INVENTOR(S) : Edward K. Huang It is certified that error appears in the above-identified patent and that said Letters Patent is hereby corrected as shown below:

In the Specification

In the Detailed Description:
Column 16, Line 7, change "the superlattice 300 may 20) be epitaxially" to -- the superlattice 300 may be epitaxially --.

Signed and Sealed this
Eighth Day of October, 2024

Katherine Kelly Vidal
*Director of the United States Patent and Trademark Office*